United States Patent
Wu et al.

(10) Patent No.: US 6,897,521 B2
(45) Date of Patent: May 24, 2005

(54) SPLIT GATE FLASH MEMORY CELL

(75) Inventors: Sheng Wu, Hsinchu (TW); Tsai-Yu Huang, Hsinchu County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/605,198

(22) Filed: Sep. 15, 2003

(65) Prior Publication Data

US 2005/0006691 A1 Jan. 13, 2005

(51) Int. Cl.[7] .......................................... H01L 29/788
(52) U.S. Cl. ................................................... 257/320
(58) Field of Search ........................................ 257/320

(56) References Cited

U.S. PATENT DOCUMENTS 5,284,784 A * 2/1994 Manley ...................... 438/263

6,476,440 B1 * 11/2002 Shin ........................... 257/320

* cited by examiner

Primary Examiner—Howard Weiss
(74) Attorney, Agent, or Firm—Jiang Chyun IP Office

(57) ABSTRACT

A split gate flash memory cell includes a substrate having a device isolation structure; a selective gate structure disposed on the substrate; an interlayer dielectric layer having an opening disposed on the substrate, wherein the opening exposes a portion of the selective gate structure, the substrate and the device isolation structure; a floating gate disposed in the opening and extended to cover a surface of the interlayer dielectric layer; a tunneling dielectric layer disposed between the floating gate and the selective gate structure; a gate dielectric layer disposed between the floating gate and the control gate; a source region disposed in the substrate on one side of the control gate that is not adjacent to the selective gate structure, and a drain region disposed in the substrate on one side of the selective gate that is not adjacent to the control gate.

10 Claims, 5 Drawing Sheets

SPLIT GATE FLASH MEMORY CELL

BACKGROUND OF INVENTION

1. Field of the Invention

The present invention relates to a semiconductor device. More particularly, the present invention relates to a split gate flash memory cell and a manufacturing method thereof.

2. Description of Related Art

A flash memory device provides the property of multiple entries, retrievals and erasures of data. Moreover, the stored information is retained even electrical power is interrupted. As a result, a non-volatile memory device is widely used in personal computers and electronic systems.

A typical flash memory device employs doped polysilicon to fabricate the floating gate and the control gate. Further, a dielectric layer is used to isolate the floating gate from the control gate, while the floating gate and the substrate are isolated from each other by a tunneling oxide layer. When a flash memory device performs the write/erase operation of information, proper biases are applied to the control gate and the source/drain regions to inject electrons into or to discharge electrons from the floating gate. Further, the reading of information from a flash memory device is achieved by applying a working voltage to the control gate. The conductive state of the floating gate influences the opening/closing of the channel, wherein the opening/closing of the channel can be interpreted as the binary value of either "0" or "1".

During the erasure of information of the above flash memory device, the amount of electrons being discharged is difficult to control. Consequently, over-erase is resulted when an excessive amount of the electrons are discharged from the floating gate, leaving the floating gate with positive charges. When the over-erase phenomenon is serious, a channel current flow is induced under the floating gate even no working voltage is applied to the control gate, leading to an erroneous interpretation of the data.

To resolve the over-erase problem, many flash memory devices uses the split gate design. The split gate design, in addition to the control gate and the floating gate, further includes a selective gate (or an erase gate) disposed on the sidewalls of the control gate and the floating gate and above the substrate, wherein the split gate is isolated from the control gate, the floating gate and the substrate with a dielectric layer. Accordingly, as the over-erase phenomenon becomes serious, in which the channel under the floating gate maintains opened even under no working voltage is being applied to the control gate, the channel under the selective gate can maintain closed to obviate a current flow between the source region and the drain region. An erroneous interpretation of the stored information can thus be precluded. Since a split gate structure demands a larger split gate region and thus a larger memory cell, the dimension of a split gate memory cell is larger than that of a stacked gate flash memory cell. Further increase of the device integration is thereby prohibited.

Normally, as the gate couple ratio (GCR) between the floating gate and the control gate becomes larger, the working voltage required for the operation diminishes. To raise the gate couple ratio includes increasing the dielectric capacity of the gate dielectric layer or reducing the dielectric capacity of the tunneling oxide layer, wherein increasing the dielectric capacity of the gate dielectric layer includes increasing the area in between the control gate layer and the floating gate. However, in a conventional split gate structure, the control gate and the floating gate form a stacked structure. The area between the control gate and the floating gate can not be further increased. As a result, the gate coupling ratio and the integration of devices can not be increased.

SUMMARY OF INVENTION

Accordingly, the present invention provides a split gate flash memory cell and a manufacturing method thereof, wherein the gate coupling ratio and the integration of devices can be increased.

The present invention also provides a split gate flash memory cell and a manufacturing method thereof, wherein an erase gate is formed to reduce the frequency of electrons (holes) that pass through the tunneling dielectric layer. The reliability of the tunneling dielectric layer is thereby increased and the life time of the device is also extended.

The present invention provides a split gate flash memory cell. The split gate flash memory cell includes a substrate configured with device isolation structures; a selective gate structure disposed on the substrate, wherein the selective gate structure includes a gate dielectric layer, a selective gate and a cap layer that are sequentially from the substrate; a spacer disposed on the sidewall of the selective gate structure; an interlayer dielectric layer disposed on the substrate, wherein this interlayer dielectric layer has an opening that exposes a portion of the selective gate structure, the substrate and the device isolation structure; a floating gate disposed in the opening and extended to cover a surface of the interlayer dielectric layer; a control gate disposed in the opening, wherein the control gate fills the opening and extends above the selective gate structure; a gate dielectric layer disposed between the floating gate and the control gate; a source region disposed in the substrate beside one side of the control gate that is not adjacent to the selective gate structure; a drain region disposed in the substrate beside one side of the selective gate structure that is adjacent to the control gate.

In the above split gate flash memory device, the control gate extends to cover the floating that is above the selective gate structure. In this type of memory device, an erase gate can also be disposed on the interlayer dielectric layer that is above the source region, and a portion of the erase gate covers the floating gate.

The present invention further provides a split gate flash memory cell. The memory cell includes a substrate with a device isolation structure; a first selective gate structure and a second selective gate structure disposed respectively on the substrate, wherein each of the first and the second selective gate structure includes a gate dielectric layer, a selective gate and a cap layer that are sequentially formed from the substrate; a spacer disposed on a sidewall of the first selective gate structure and on a sidewall of the second selective gate structure; an interlayer dielectric layer that includes a first opening and a second opening on the substrate, wherein the first opening and the second opening are configured between the first selective gate structure and the second selective gate structure, and the first opening exposes a portion of the first selective gate structure, the substrate and the device isolation structure and the second opening exposes a portion of the second selective gate structure, the substrate and the device isolation structure; a first floating gate and a second floating gate disposed in the first opening and the second opening, respectively, wherein the first floating gate and the second floating gate extend to cover the surface of the interlayer dielectric layer; a tunneling dielectric layer disposed between the first floating gate and the substrate and between the second floating gate and the substrate; a first control gate and a second control gate disposed in the first opening and the second opening, respectively, wherein the first control gate and the second control gate fill the first opening and the second opening, respectively, and extend above the first gate structure and the second gate structure, respectively; an erase gate disposed on the interlayer dielectric layer between the first control gate and the second control gate and covered a portion of the first floating gate and the second floating gate; a gate dielectric layer disposed between the first floating gate and the first control gate and between the first floating gate and the erase gate, and between the second floating gate and the second control gate and between the second floating gate and the erase gate; a source region disposed in the substrate between the first control gate and the second control gate; a first drain region and a second drain region disposed in the substrate beside one side of the first selective gate structure that is not adjacent to the first control gate and beside one side of the second selective gate structure that is not adjacent to the second control gate, respectively; a bit line disposed on the substrate, wherein the bit line electrically connects with the first drain region and the second drain region.

In the above split gate flash memory cell, the first control gate extends to cover the first floating gate above the first selective gate structure, and the second control gate extends to cover the second floating gate above the second selective gate structure. The bit line is electrically connected to the first drain region and the second drain region through the contact plug.

In the above split gate flash memory cell, the openings expose a portion of the selective gate structures, the substrate and the device isolation structure. The floating gates are disposed in the openings and extend to cover the surface of a part of the interlayer dielectric layer. The control gates are disposed in the openings, respectively, and extend above the selective gate structures. The contact area between the control gate and the floating gate is thereby increased to increase the gate coupling ratio of the flash memory device and to lower the working voltage required for an operation. As a result, the operation speed increases to accommodate the demand of a particular memory device.

Further, the erase gate is disposed on the interlayer dielectric layer. During the erasure operation, electrons (holes) travel from the corner of the floating gate through the gate dielectric layer to the erase gate. The frequency that the electron (holes) pass through the tunneling dielectric layer is thus reduced to increase the reliability of the tunneling dielectric layer. The lifetime of the device is also increased.

Moreover, the erase gate needs not be disposed. The control gate that is disposed above the selective gate structure covers the floating gate and extends to cover the interlayer dielectric layer. As a result, during the erasure operation, electrons (holes) travel from the corner of the floating gate through the gate dielectric layer to the control gate. Similarly, the frequency of the electrons (holes) that pass through the tunneling dielectric layer is reduced to enhance the reliability of the device and to increase the lifetime of the device.

The present invention provides a fabrication method for a split gate flash memory cell, wherein a substrate having a device isolation structure already formed therein is provided. A selective gate structure is formed on the substrate, wherein the selective gate structure includes a gate dielectric layer, a conductive layer and a cap layer. After forming a spacer on the sidewall of the selective gate structure, a source region and a drain region are formed in the substrate beside both sides of the selective gate structure, wherein the source region is at a certain distance away from the selective gate structure, while the drain region is adjacent to the selective gate structure. After forming an interlayer dielectric layer on the substrate, an opening is formed in the interlayer dielectric layer, wherein the opening exposes the substrate between the selective gate structure and the source region, a portion of the selective gate structure and the device isolation structure. After forming a tunneling dielectric layer on the substrate exposed by the opening, a floating gate is formed in the opening, wherein the floating gate extends to cover a part of the interlayer dielectric layer. Thereafter, a gate dielectric layer is formed on the substrate and a control gate is also formed on the substrate, filling the opening.

In the above fabrication method, during the formation of the control gate, the control gate is formed to cover the floating gate that is above the selective gate structure. Moreover, an erase gate can also be concurrently formed during the fabrication of the control gate.

In the above fabrication method, during the formation of the opening, since the etching selectivity of the cap layer and the spacer of the selective gate structure is different from that of the interlayer dielectric layer, the cap layer and the spacer can serve as a self-aligned mask during the formation of the opening to increase the process window.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
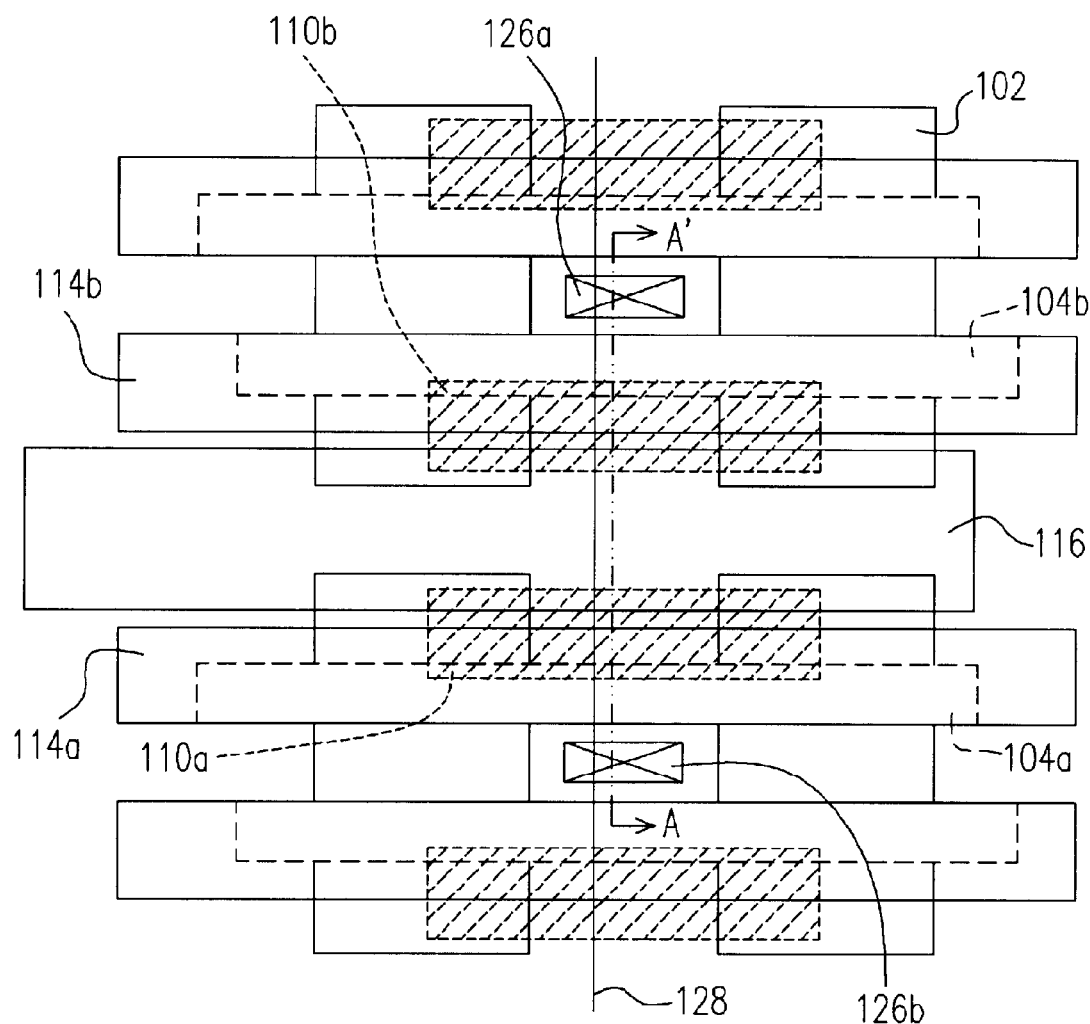
FIG. 1 is a schematic, top view diagram illustrating a structure of a split gate flash memory cell according to the present invention.
Figure 2A:
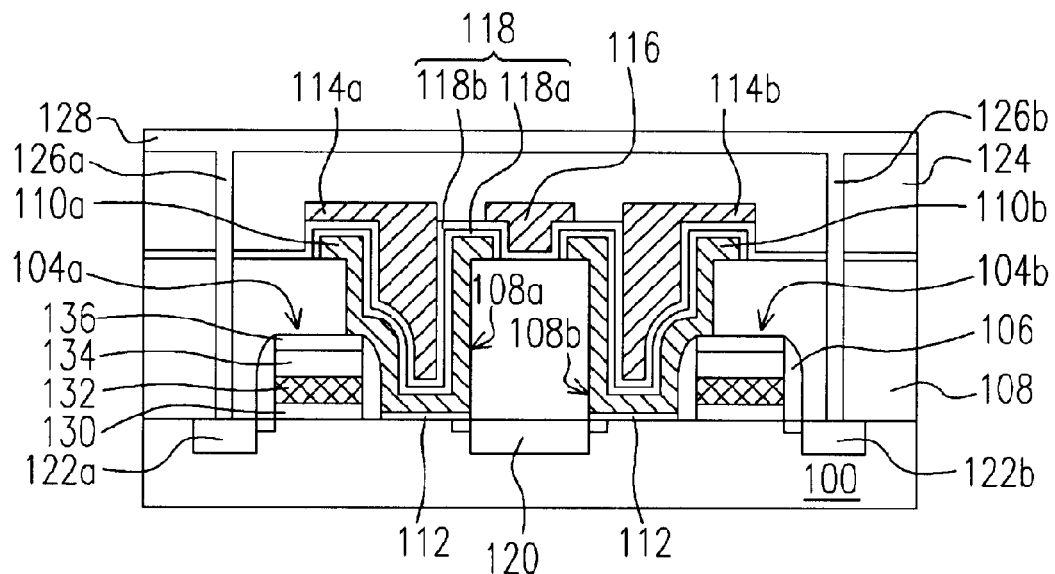
FIG. 2A is a schematic, cross-sectional view diagram of a split gate flash memory cell according to one aspect of the present invention.
Figure 2B:
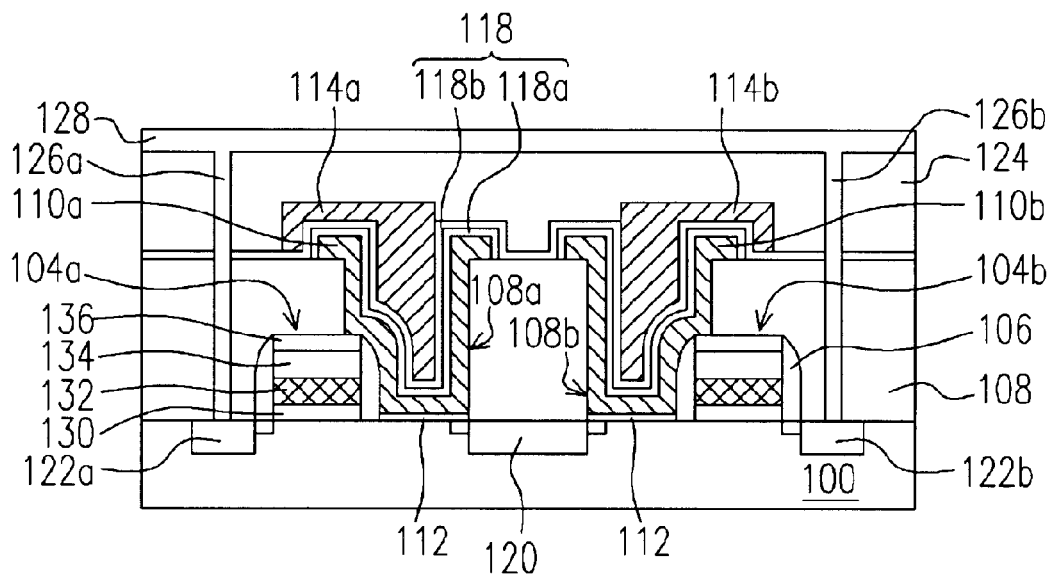
FIG. 2B is a schematic, cross-sectional view diagram of a split gate flash memory cell according to another aspect of the present invention.

FIG. 1 is a schematic, top view diagram illustrating a structure of a split gate flash memory cell according to the present invention. FIG. 2A is a schematic, cross-sectional view diagram of a split gate flash memory cell according to one aspect of the present invention. FIG. 2A is a cross-sectional view diagram of FIG. 1 along the cutting line A—A. FIG. 2B is a schematic, cross-sectional view diagram of a split gate flash memory cell according to another aspect of the present invention. In FIGS. 1, 2A and 2B, the same reference numbers are used in the drawings to refer to the same or like parts.

Referring to both FIGS. 1 and 2A, the flash memory cell of the present invention is formed with a substrate 100, a device isolation structure 102, an inter-layer dielectric layer 108, a floating gate 110a and a floating gate 110b, a tunneling dielectric layer 112, a control gate 114a and a control gate 114b, an erase gate 116, a gate dielectric layer 118, a source region 120, a drain region 122a, a drain region 122b, an interlayer dielectric layer 124, a contact plug 126a, a contact plug 126b and a bit line 128.

The substrate 100 is, for example, a silicon substrate. The device isolation structure 102 is disposed in the substrate 100 to define the active region.

The selective gate structure 104a and the selective gate structure 104b are disposed on the substrate 100. Each of the selective gate structure 104a and the selective gate structure 104b includes a gate dielectric layer 130, a selective gate 132 and cap layers 134 and 136, sequentially from the substrate 100. A material used in forming the gate dielectric layer 130 is, for example, silicon oxide. A material used in forming the selective gate 132 is, for example, doped polysilicon. The cap layers 134 and 136 are formed with, for example, a layer of silicon oxide and a layer silicon nitride, respectively.

A spacer 106 is disposed on the sidewalls of the selective gate structure 104a and the selective gate structure 104b. The spacer 106 is, for example, a silicon nitride material.

The interlayer dielectric layer 108 is disposed on the substrate 100. The interlayer dielectric layer 108 has an opening 108a and an opening 108b, wherein the opening 108a and the opening 108b are configured between the selective gate structure 104a and the selective gate structure 104b. In other words, the opening 108a and the opening 108b are disposed on one side of the selective gate structure 104a and on one side of the selective gate structure 104b, respectively. The opening 108a exposes a portion of the selective gate structure 104a, the substrate 100 and the device isolation structure 102. The opening 108b exposes a portion of the selective gate structure 104b, the substrate 100 and the device isolation structure 102. The interlayer dielectric layer 108 is, for example, phosphsilicate glass or borophosphosilicate glass type of material.

The floating gate 110a and the floating gate 110b are disposed in the opening 108a and 108b, respectively, wherein portions of the floating gates 110a, 110b extend to cover the surface of the interlayer dielectric layer 108. The floating gate 110a and the floating gate 110b are formed with, for example, doped polysilicon.

The tunneling dielectric layer 112 is disposed between the floating gate 110a and the substrate 100 and between the floating gate 110b and the substrate 100. A material used in forming the tunneling dielectric layer 112 is, for example, silicon oxide.

The control gate 114a and the control gate 114b are disposed in the opening 108a and the opening 108b, respectively, and extended above the selective gate structure 104a and the selective gate structure 104b, respectively. The control gate 114a and the control gate 114b are formed with, for example, doped polysilicon.

The erase gate 116 is disposed above the interlayer dielectric layer 108 between the control gate 114a and the control gate 114b. Further, a portion of the erase gate 116 covers the floating gate 110a and the floating gate 110b. The erase gate 116 is, for example, doped polysilicon.

The gate dielectric layer 118 is disposed between the floating gate 110a and the control gate 114a and between the floating gate 110a and the erase gate 116, and between the floating gate 110b and the control gate 114b and between the floating gate 110b and the erase gate 116. The gate dielectric layer 118 can form with, for example, silicon oxide/silicon nitride/silicon oxide. The gate dielectric layer can also form with, for example, a composite dielectric layer 118a and a composite dielectric layer 118b. The composite dielectric layer 118a is formed with, for example, silicon oxide/silicon nitride/silicon oxide, while the composite dielectric layer 118b is formed with, for example, silicon oxide.

The source region 120 is configured in the substrate 100 between the control gate 114a and the control gate 114b. In other words, the source region 120 is configured in the substrate 100 at the one side of the control gate 114a (control gate 114b) that is not adjacent to the selective gate structure 104a (selective gate structure 104b). The drain region 122a and the drain region 122b are configured in the substrate 100 at the one side of the selective gate structure 104a that is not adjacent to the control gate 114a, and at the one side of the selective gate structure 104b that is not adjacent to the control gate 114b, respectively. The source region 120, the drain region 122a and the drain region 122b can also include, for example, a light doped drain (LDD) structure.

The interlayer dielectric layer 124 is disposed on the substrate 100, covering the entire substrate 100. The interlayer dielectric layer 124 includes a material, such as, phosphsilicate glass or borophosphosilicate glass, etc.

The contact plug 126a and the contact plug 126b are disposed in the interlayer dielectric layer 104 and the inter-layer dielectric layer 124 to electrically connect with the drain region 122a and the drain region 122b, respectively. The material used in forming the contact plug 126a and the contact plug 126 includes, for example, tungsten. Further, the contact plug 126a, the contact plug 126b, and the interlayer dielectric layer 108, the interlayer dielectric layer 124 and the substrate further include a barrier layer (not shown) disposed therebetween, wherein the barrier layer is, for example, titanium/titanium nitride.

The bit line 128 is disposed above the substrate 100, and is electrically connected to the contact plugs 126a, 126b. The bit line 128 is, for example, a copper-aluminum alloy.

In accordance to the above embodiment of the present invention, the opening 108a (opening 108b) exposes a portion of the selective gate structure 104a (selective gate structure 104b), the substrate 100 and the device isolation structure 102. The floating gate 110a and the floating gate 110b are disposed in the opening 108a and the opening 108b, respectively, and are extended to cover the surface of the interlayer dielectric layer 108. The control gate 114a and the control gate 114b are disposed in and fill the openings 108a and 108b, respectively. The control gates 114a, 114b further extends above the selective gate structure 104a and selective gate structure 104b, respectively. The contact area between the control gate 114a (control gate 114b) and the floating gate 110a (floating gate 110b) can thus increase to increase the gate coupling ratio of the flash memory device and to lower the working voltage required for an operation. The operation speed of the device can thus increase to accommodate the demands of each particular memory device.

Further, the erase gate 116 is disposed above the interlayer dielectric layer 108 between the control gate 114a and the control gate 114b. Moreover, a portion of the erase gate 116 covers the floating gate 110a and the floating gate 110b. During an erasing operation, the electrons (holes) travel from the corner of the floating gate 110a (floating gate 119b) through the gate dielectric layer 118 to the erase gate 116.

The frequency of electrons (holes) passing through the tunneling dielectric layer 112 is thus reduced to enhance the reliability of the tunneling dielectric layer 112 and to extend the life time of the device.

In accordance to the present invention, the presence of an erase gate 116 is used for illustration. However, the present invention is also applicable, as in FIG. 2B, without the disposition of an erase gate structure. Referring to FIG. 2B, the control gate 114a (control gate 114b) is disposed above the selective gate structure 104a (selective gate structure 104b), covering the floating gate 110a (floating gate 110b). The control gate 114a (control gate 114b) further extends to cover a part of the interlayer dielectric layer 108. During an erasing operation, the electrons (holes) travel from the corner of the floating gate 110a (the floating gate 110b) through the gate dielectric layer 118 to the control gate 114a (control gate 114b). The number of times that the electrons (holes) pass through the tunneling dielectric layer 112 is thus reduced to enhance the reliability of the tunneling dielectric layer 112. The life time of the device also increases.

FIGS. 3A to 3F are schematic, cross-sectional view diagrams illustrating the process flow in fabricating a split gate flash memory cell of the present invention, and are used to illustrate the fabrication method for a flash memory device. FIGS. 3A to 3F are cross-section view diagrams of FIG. 1 along the cutting line A—A.

Figure 3A:
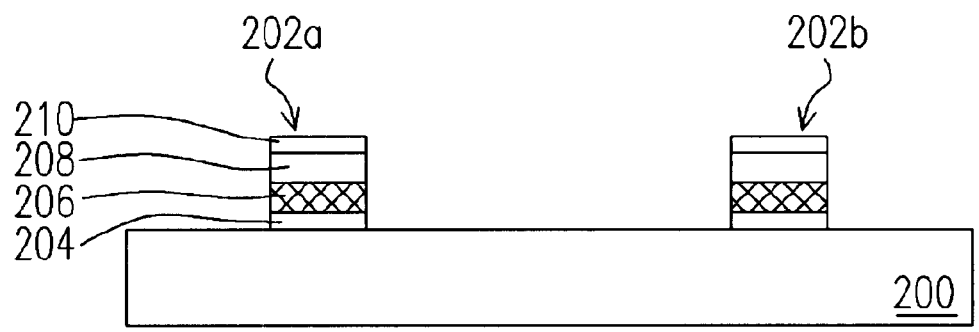
FIGS. 3A to 3F are schematic, cross-sectional view diagrams illustrating the process flow for fabricating a split gate flash memory cell of the present invention.

Referring to FIG. 3A, a substrate 200 is provided. The substrate 200 is, for example, a silicon substrate. The substrate 200 is formed with, for example, device isolation structure (not shown in Figure) to define the active region. The device isolation structure is formed by, for example, local oxidation (LOCOS) or the shallow trench isolation (STI) method.

Thereafter, a selective gate structure 202a and a selective gate structure 202b are formed on the substrate 200. Each of the selective gate structure 202a and the selective gate structure 202b is formed by, for example, forming a stacked structure of a gate dielectric layer 204, a conductive layer 206, a cap layer 208 and a cap layer 210, and subsequently patterning the stacked structure.

The gate dielectric layer 204 is, for example, silicon oxide, wherein the gate dielectric layer 204 is formed by, for example, thermal oxidation. The conductive layer 206 is, for example, doped polysilicon, and the conductive layer 206 is formed by, for example, conducting chemical vapor deposition to form an undoped polysilicon layer, followed by performing an ion implantation process. A material used in forming the cap layer 208 includes, for example, silicon oxide, wherein the cap layer 208 is formed by performing chemical vapor deposition, using tetra ethyl ortho silicate (TEOS)/Ozone ($O_3$) as a gas source. The etching selectivity of the material used in forming the cap layer 210 is different from that of the subsequently formed interlayer dielectric layer. The material used in forming the cap layer 210 is, for example, silicon nitride. The cap layer 210 is formed by, for example, chemical vapor deposition. The patterned conductive layer 206 serves as the selective gate of the memory cell, while the gate dielectric layer 204 serves as the selective gate dielectric layer.

Figure 3B:
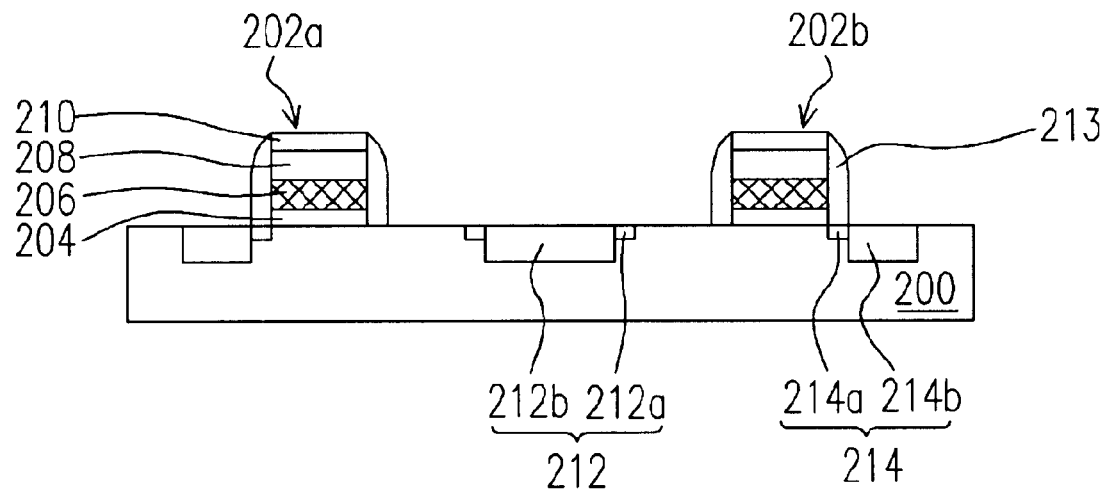

Referring to FIG. 3B, a lightly doped region 212a and a lightly doped region 214a are formed in the substrate 200, wherein the lightly doped region 212a is configured between the selective gate structure 202a and the selective gate structure 202b and at a certain distance away from the selective gate 202a and the selective gate 202b, respectively. The lightly doped region 214a is formed in the substrate 200 at one sides of the selective gate 202a and the selective gate 202b where the lightly doped region 212a is not formed. The lightly doped region 212a and the lightly doped region 214a are formed by, for example, forming a patterned photoresist layer (not shown) on the substrate 200, wherein the patterned photoresist layer exposes the substrate 200 where the lightly doped region 212a and the lightly doped region 214a are going to be formed, followed by performing an ion implantation process to form the lightly doped region 212a and the lightly doped region 214a and then removing the patterned photoresist layer.

Thereafter, a spacer 213 is formed over the sidewall of the selective gate structure 202a and the selective gate structure 202b, wherein the etching selectivity of the material used in forming the spacer 213 is different from that of the subsequently formed dielectric layer. A material used in forming the spacer 213 includes, for example, silicon nitride. Forming the spacer 213 includes, for example, forming an insulation layer (silicon nitride) on a substrate 200, followed by performing an anisotropic etching.

Thereafter, a heavily doped region 212b and a heavily doped region 214b are formed in the substrate 200. The heavily doped region 212b is disposed between and is at a certain distance away from both the selective gate structure 202a and the selective gate structure 202b. The heavily doped region 214b is formed in the substrate 200 at the sides of the selective gate structure 202a and the selective gate structure 202b where the heavily doped region 212b has not been formed. The heavily doped region 212b and the heavily doped region 214b are formed by, for example, forming a patterned photoresist layer (not shown), wherein the patterned photoresist layer exposes the substrate 200 where the heavily doped region 212b and the heavily doped region 214b are going to be formed. Further using the patterned photoresist layer and the spacer 213 as a mask, an ion implantation is conducted to form the heavily doped region 212b and the heavily doped region 214b, followed by removing the patterned photoresist layer. Moreover, the lightly doped region 212a and the heavily doped region 212b together form the source region 212, while the lightly doped region 214a and the heavily doped region 214b together form the drain region 214.

Figure 3C:
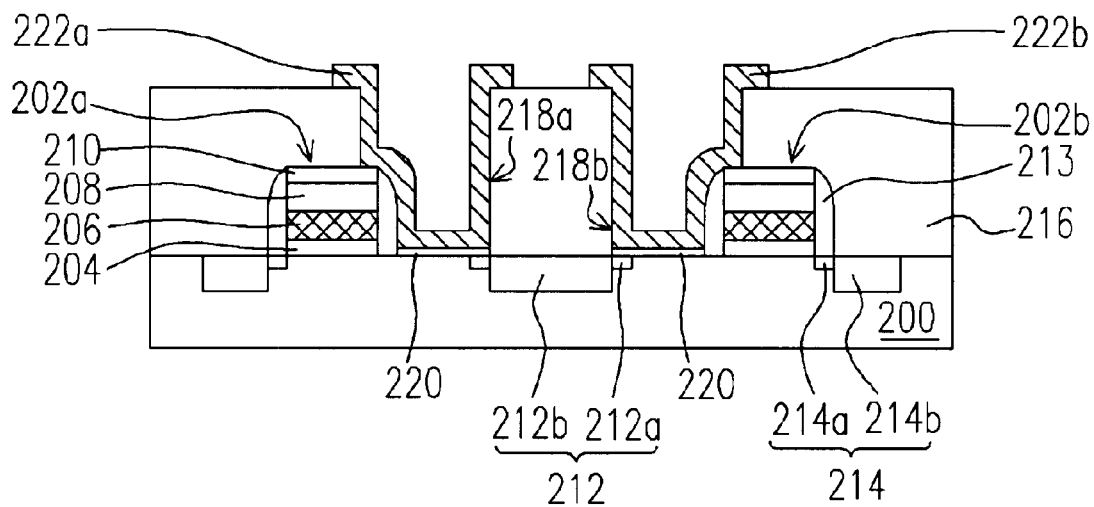

Continuing to FIG. 3C, an interlayer dielectric layer 216 is formed on the substrate 200. The interlayer dielectric layer 216 is formed with, for example, phosphosilicate glass, borophosphosilicate glass, or other dielectric material. The inter-layer dielectric layer 216 is formed by, for example, chemical vapor deposition. Thereafter, a patterned photoresist layer (not shown) is formed on the substrate 200. Using the patterned photoresist layer as a mask, a portion of the interlayer dielectric layer 216 is removed to form the opening 218a and the opening 218b, followed by removing the patterned photoresist layer. The opening 218a exposes the substrate between the selective gate structure 202a and the source region 212, a portion of the selective gate structure 202a and the device isolation structure. The opening 218b exposes the substrate between the selective gate structure 202b and the source region 212, a portion of the selective gate structure 202b and the device isolation structure. In this process step, since the cap layer and the spacer of the selective gate structure 202a (selective gate structure 202b) are, for example, a silicon nitride material, their etching selectivity is different from that of the interlayer dielectric layer 216. Therefore, during the formation of the opening 218a and the opening 218b, the cap layer 210 and the spacer 213 can serve as a self-aligned mask to increase the process window.

Thereafter, a tunneling dielectric layer 220 is formed on the substrate 200 exposed by the opening 218a and the opening 218b. The tunneling dielectric layer 220 is, for example, a silicon oxide material, formed by a method, such as, thermal oxidation.

Still referring to FIG. 3C, a floating gate 222a and a floating gate 222b are respectively formed in the opening 218a and the opening 218b. The floating gate 222a and the floating gate 222b extend to cover a portion of the surface of the interlayer dielectric layer 216. The floating gate 222a and the floating gate 222b are formed with, for example, doped polysilicon, using a method, such as, performing chemical vapor deposition to form an undoped polysilicon layer, followed by implanting dopants into the undoped polysilicon layer to form the doped polysilicon layer and then patterning the doped polysilicon layer.

Figure 3D:
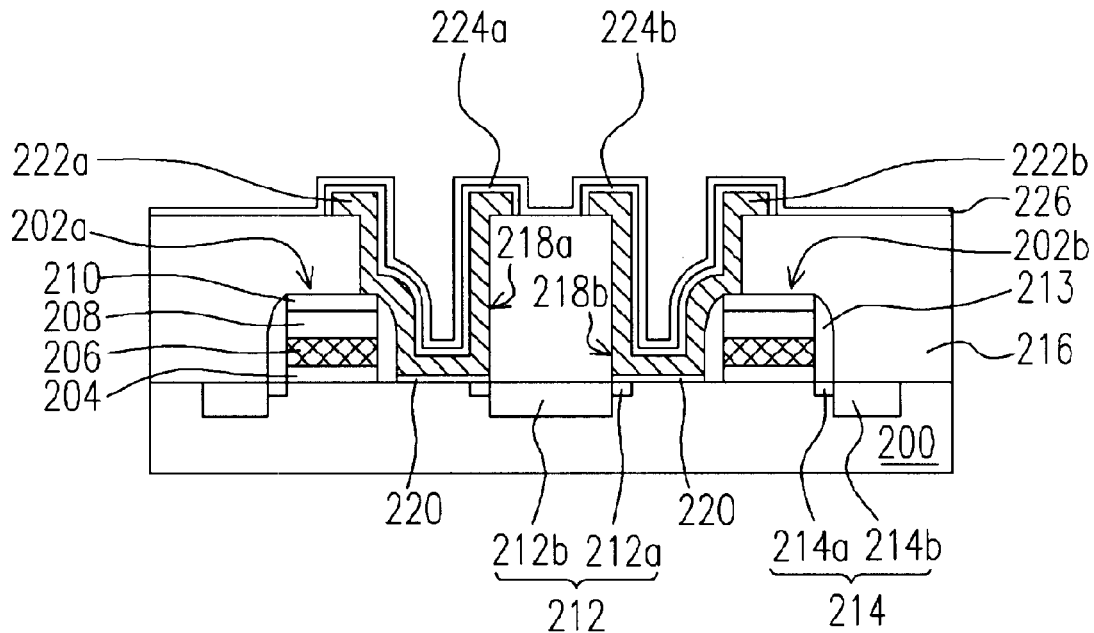

Referring to FIG. 3D, a gate dielectric layer 224a and a gate dielectric layer 224b are formed on the substrate 200. Each of the gate dielectric layer 224a and the gate dielectric layer 224b is, for example, a composite dielectric layer, which is formed with a material, such as, silicon oxide/silicon nitride/silicon oxide. The gate dielectric layer 224a and the gate dielectric layer 224b are formed by, for example, using a thermal oxidation method to form a silicon oxide layer, followed by using chemical vapor deposition to form sequentially a silicon nitride layer and another silicon oxide layer, and then patterning the silicon oxide/silicon nitride/silicon oxide layer. Consequently, the gate dielectric layer 224a and the gate dielectric layer 224b are only configured on the surfaces of the floating gate 222a and the floating gate 222b, respectively.

The gate dielectric layer 226 is then formed on the substrate The gate dielectric layer 226 is, for example, silicon oxide, formed by a method, such as, chemical vapor deposition.

Figure 3E:
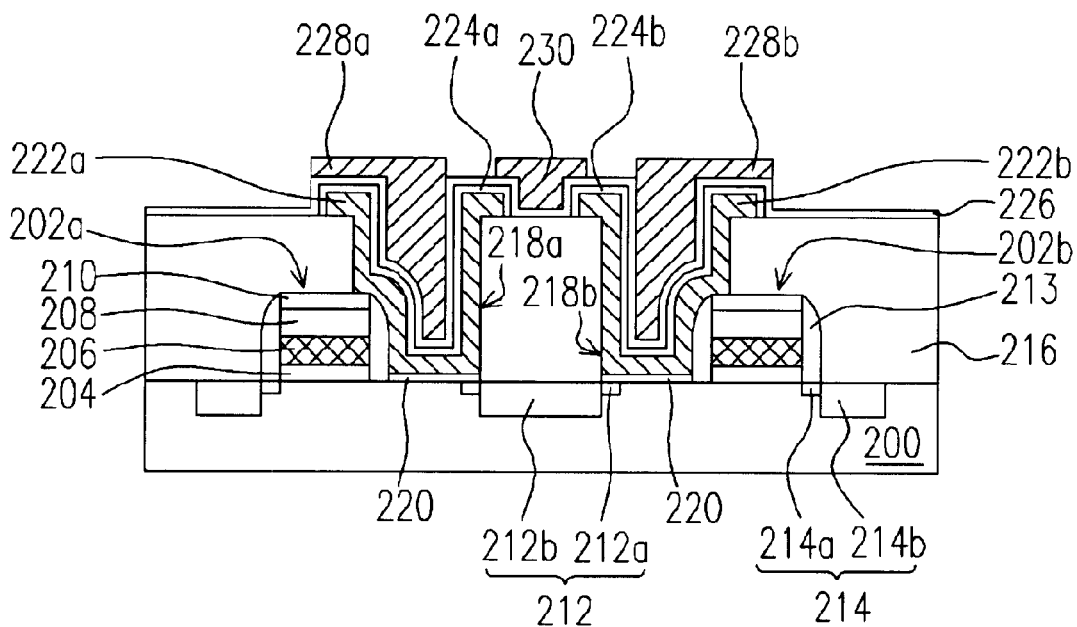

Referring to FIG. 3E, a control gate 228a and a control gate 228b are formed on the substrate 200, filling the opening 218a and the opening 218b, respectively. Further, an erase gate 230 is concurrently formed on the interlayer dielectric layer 216 between the control gate 228a and the control gate 228b, wherein the control gate 228a and the control gate 228b extend above the selective gate structure 202a and the selective gate structure 202b, respectively. A portion of the erase gate 230 covers the floating gate 222a and the floating gate 222b. The control gate 228a and the control gate 228b are formed with, for example, doped polysilicon. The floating gate 222a, the floating gate 222b, the erase gate are formed by, for example, using chemical vapor deposition to form a layer of undoped polysilicon layer, and conducting an ion implantation process to dope the undoped polysillicon layer to form the doped polysilicon layer, followed by patterning the polysilicon layer.

Figure 3F:
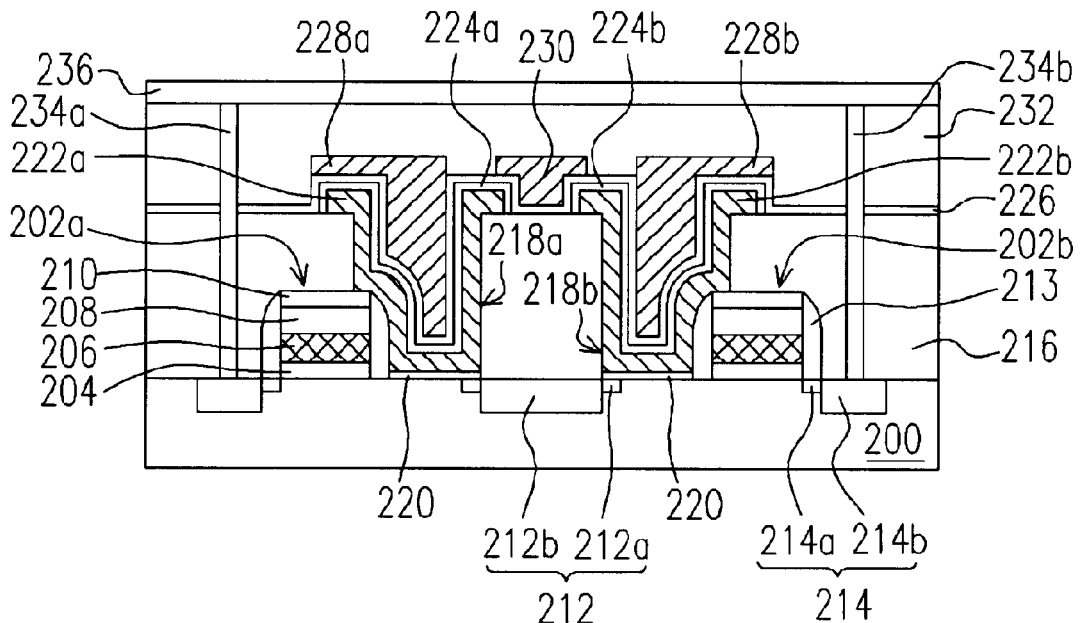

Referring to FIG. 3F, an interlayer dielectric layer 232 is formed over the substrate 200. The interlayer dielectric layer 232 is, for example, phosphsilicate glass or borophosphosilicate glass. This interlayer dielectric layer 232 is formed by, for example, chemical vapor deposition. A chemical mechanical polishing process is then conducted to planarize the surface of the interlayer dielectric layer 232. Contact plug 234a and contact plug 234b are formed in the interlayer dielectric layer 232 and the inter-layer dielectric layer 216 to electrically connect with the drain region 214. The contact plug 234a and the contact plug 234b are formed with, for example, a tungsten material by a method that includes forming an opening (not shown) that exposes the drain region 214 in the interlayer dielectric layer 232 and the interlayer dielectric layer 216, followed by filling the opening with a conductive material. Thereafter, a conductive line 236 (bit line) is formed on the interlayer dielectric layer 232. This conductive line 236 (bit line) electrically connects with the contact plug 234a and the contact plug 234b. The conductive line 236 (bit line) is formed by, for example, forming a conductive layer (not shown) on the substrate 100, followed by performing a photolithography and etching process to form the stripe shaped conductive layer 236 (bit line). The subsequent fabrication process of the flash memory device is well known to those skilled in the art and will not be further reiterated.

In this aspect of the present invention, during the formation of the control gate 228a and the control gate 228b, the erase gate 230 needs not be formed. Instead, the control gate 228a and the control gate 228b are formed to cover the floating gate 110a and the floating gate 100b above the selective gate structure 202a and the selective gate structure 202b.

In the above aspect of the present invention, the cap layer 210, the selective gate structure 202a (selective gate structure 202b) and the spacer 213 are formed with a silicon nitride material, which has an etching selectivity different from that of the interlayer dielectric layer 216. Therefore, during the formation of the opening 218a and the opening 218b, the cap layer 210 and the spacer 213 can serve as a self-aligned mask to increase the process window.

Further, during the programming of the above split gate flash memory cell, a voltage of about, for example, 6 volts to 8 volts, is applied to the control gate, and a voltage of about, for example, 1.5 volt to 3 volts, is applied to the selective gate, while the drain region is grounded and a voltage of 4 volts to 7 volts is applied to the source region to program the split gate flash memory cell using tunneling hot carrier injection mode.

During the reading of this split gate flash memory cell, a voltage of about 2 volts is applied to the control gate, a voltage of about 2 volts to 5 volts is applied to the selective gate, while the source region is floating and a voltage of about 2 volts is applied to the drain region.

To erase the above split gate flash memory, a voltage of about, for example, −6 volts to 10 volts is applied to the control gate, while the drain region and the source region are kept floating, and a voltage of about 4 volts to 7 volts is applied to the gate using the FN tunneling effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A split gate flash memory cell, comprising:
   a substrate, wherein a device isolation structure is configured in the substrate to define an active region;
   a selective gate structure, disposed on the substrate, wherein the selective gate structure comprises, sequentially from the substrate, a first gate dielectric layer, a selective gate and a cap layer;
   a spacer, disposed on a sidewall of the selective gate structure;
   an interlayer dielectric layer, disposed on the substrate, wherein the interlayer dielectric layer comprises an opening, disposed on one side of the selective gate structure, exposing a portion of the selective gate structure, the substrate and the device isolation structure;

a floating gate, disposed in the opening, wherein a portion of the floating gate extends to cover a surface of the interlayer dielectric layer;

a tunneling dielectric layer, disposed between the substrate and the floating gate;

a control gate, formed over the floating gate and disposed in the opening, filling the opening and extending above the selective gate structure;

a second gate dielectric layer, disposed between the floating gate and the control gate;

a source region, disposed in the substrate at a side of the control gate that is not adjacent to the selective gate; and a drain region, disposed in the substrate on a side of the selective gate that is not adjacent to the control gate.

2. The memory cell of claim 1 further comprises an erase gate, disposed on the interlayer dielectric layer above the source region, wherein a portion of the erase gate covers the floating gate.

3. The memory cell of claim 2, wherein the second gate dielectric layer is further disposed between the erase gate and the floating gate.

4. The memory cell of claim 1, wherein the control gate extends to cover the floating gate above the selective gate structure.

5. The memory cell of claim 1, wherein an etching selectivity of the cap layer and the spacer is different from that of the interlayer dielectric layer.

6. A split gate flash memory device, comprising:

a substrate, wherein a device isolation structure is configured in the substrate to define an active region;

a first selective gate structure and a second selective gate structure, disposed respectively on the substrate, wherein each of the first selective gate structure and the second selective structure comprises a first gate dielectric layer, a selective gate and a cap layer;

a spacer, disposed on a sidewall of the first selective gate structure and the second selective gate structure;

an interlayer dielectric layer, disposed on the substrate, wherein the interlayer dielectric layer comprises a first opening and a second opening, and the first opening and the second opening are configured between the first selective gate structure and the second selective gate structure, and the first opening exposes a portion of the first selective gate structure, the substrate and the device isolation structure, and the second opening exposes a portion of the second selective gate structure, the substrate and the device isolation structure;

a first floating gate and a second floating gate, disposed in the first opening and the second opening, respectively, and extended to cover a surface of the interlayer dielectric layer;

a tunneling dielectric layer, disposed between the first floating gate and the substrate, and between the second floating gate and the substrate;

a first control gate and a second control gate, wherein the first and the second control gates are disposed in the first opening and the second opening, respectively, the first and the second control gates fill the first opening and the second opening, respectively, and the first and the second control gates extend above the first selective gate structure and the second selective gate structure, respectively;

an erase gate, disposed on the interlayer dielectric layer that is in between the first control gate and the second control gate, wherein a portion of the erase gate covers the first floating gate and the second floating gate;

a second gate dielectric layer, disposed between the first floating gate and the first control gate and between the first floating gate and the erase gate, and between the second floating gate and the second control gate and between the second floating gate and the erase gate;

a source region, disposed in the substrate between the first control gate and the second control gate;

a first drain region and a second drain region, configured in the substrate, at one side of the first selective gate that is not adjacent to the first control gate, and at one side of the second selective gate that is not adjacent to the second control gate; and a bit line, disposed on a substrate and electrically connected to the first drain region and the second drain region.

7. The memory device of claim 6, wherein the second gate dielectric layer comprises a silicon oxide/silicon nitride/silicon oxide layer.

8. The memory device of claim 6, wherein the first control gate covers the first floating gate above the first selective gate structure, and the second control gate covers the second floating gate above the second selective gate structure.

9. The memory device of claim 6, wherein the bit line is electrically connected to the first drain region and the second drain region through a contact plug, respectively.

10. The memory device of claim 6, wherein an etching selectivity of the cap layer and the spacer is different from that of the interlayer dielectric layer.

* * * * *